(12) United States Patent
Lee et al.

(10) Patent No.: US 12,243,727 B2
(45) Date of Patent: Mar. 4, 2025

(54) SUBSTRATE PROCESSING APPARATUS INCLUDING ELECTROSTATIC CHUCK, SUBSTRATE PROCESSING METHOD, AND METHOD OF MANUFACTURING ELECTROSTATIC CHUCK

(71) Applicant: SEMES CO., LTD., Cheonan-si (KR)

(72) Inventors: Dong Chan Lee, Anseong-si (KR); Kyo Bong Kim, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 104 days.

(21) Appl. No.: 17/889,298

(22) Filed: Aug. 16, 2022

(65) Prior Publication Data
US 2023/0064141 A1 Mar. 2, 2023

(30) Foreign Application Priority Data
Aug. 24, 2021 (KR) .......................... 10-2021-0111958

(51) Int. Cl.
*H01J 37/32* (2006.01)
*H01L 21/683* (2006.01)
*H01L 21/687* (2006.01)

(52) U.S. Cl.
CPC .... *H01J 37/32715* (2013.01); *H01L 21/6833* (2013.01); *H01L 21/68742* (2013.01); *H01J 2237/2007* (2013.01); *H01J 2237/20235* (2013.01); *H01J 2237/334* (2013.01)

(58) Field of Classification Search
CPC ......... H01J 37/32715; H01J 2237/2007; H01J 2237/20235; H01J 2237/334; H01L 21/6833; H01L 21/68742; H01L 21/67103; H01L 21/67109; H01L 21/6831; H01L 21/67069; H01L 21/68757; H01L 21/68785; B23Q 3/15; H02N 13/00; H10N 30/20
USPC ........................................................ 361/234
See application file for complete search history.

(56) References Cited

U.S. PATENT DOCUMENTS

| | | | |
|---|---|---|---|
| 2014/0216332 A1* | 8/2014 | Omori | H01L 21/68742 118/50 |
| 2019/0019714 A1* | 1/2019 | Kosakai | H01L 21/68757 |

FOREIGN PATENT DOCUMENTS

| | | | |
|---|---|---|---|
| CN | 107180782 A | * | 9/2017 |
| JP | 2020115519 A | * | 7/2020 |
| KR | 10-0638059 | | 10/2006 |
| KR | 100638059 B1 | * | 10/2006 |
| KR | 20070006276 A | * | 1/2007 |
| KR | 101045247 B1 | * | 6/2011 |

(Continued)

OTHER PUBLICATIONS

Office Action from the Korean Intellectual Property Office dated Apr. 14, 2023.

*Primary Examiner* — Thienvu V Tran
*Assistant Examiner* — Sreeya Sreevatsa (57) ABSTRACT

An electrostatic chuck includes a chuck body which supports a substrate, at least one pin hole penetrating the chuck body in a vertical direction, a lift pin disposed in one of the at least one pin hole, wherein the lift pin moves along the one of the at least one pin hole, and an expansion member which is provided at an inner circumference of the one of the at least one pin hole, the expansion member having an inner circumferential surface that, in response to a first power, selectively holds or releases an outer circumferential surface of the lift pin.

20 Claims, 4 Drawing Sheets

(56) References Cited

FOREIGN PATENT DOCUMENTS

KR    10-2016-0086271    7/2016

\* cited by examiner

SUBSTRATE PROCESSING APPARATUS INCLUDING ELECTROSTATIC CHUCK, SUBSTRATE PROCESSING METHOD, AND METHOD OF MANUFACTURING ELECTROSTATIC CHUCK

CROSS REFERENCE TO RELATED APPLICATION

The present application claims priority to Korean Patent Application No. 10-2021-0111958, filed Aug. 24, 2021, the entire contents of which are incorporated by reference herein for all purposes.

BACKGROUND OF THE INVENTION

Field of the Invention

The present disclosure relates to a substrate processing apparatus including an electrostatic chuck for processing a substrate such as a semiconductor wafer and so on, to a substrate processing method, and to a method of manufacturing the electrostatic chuck.

Description of the Related Art

Recently, in a process of manufacturing a semiconductor element, a plasma processing device has been widely used in a process of forming a layer on a semiconductor substrate or in a process of etching the layer.

The plasma processing device includes a processing chamber having a space for processing the semiconductor substrate, and includes a substrate supporting device which is disposed inside the processing chamber and which supports the semiconductor substrate.

An electrostatic chuck is an example of the substrate supporting device. Generally, the electrostatic chuck includes a base plate formed of aluminum, a ceramic puck disposed at an upper portion of the base plate, and an internal electrode provided inside the ceramic puck. A power source for generating an electrostatic force is connected to the internal electrode, and the semiconductor substrate is adsorbed and fixed on the electrostatic chuck by the electrostatic force.

The semiconductor substrate positioned on the electrostatic chuck is heated by plasma gas, and a cooling gas for controlling a temperature of the semiconductor substrate is supplied to a backside of the semiconductor substrate. Helium (He) gas is mainly used as a cooling gas, and the cooling gas is supplied to the backside of the semiconductor substrate through cooling gas supplying holes formed in the base plate and the ceramic puck.

In addition, a pin hole formed through the base plate and the ceramic puck exists, and a substrate can be detached by moving a lift pin up and down in the pin hole.

With the trend toward miniaturization in semiconductors, higher RF power is required for plasma generation. This may lead to a serious problem of an electrical discharge phenomenon (for example: arcing) in the cooling gas supplying holes and in the pin hole. The electrical discharge phenomenon may cause damage to the substrate supporting device and to the substrate. Particularly, since a diameter of the pin hole is larger than a diameter of the cooling gas supplying holes, the problem as described above may frequently occur in the pin hole.

For example, in a state in which the substrate is adsorbed and supported by the electrostatic chuck, there is a high possibility that the helium gas supplied to the cooling gas supplying holes will be introduced into the pin hole. Further, when the temperature of the substrate increases locally and an atmosphere in which the helium gas stagnated in the pin hole becomes high temperature is formed, a plasma discharge occurs in the pin hole, and the substrate and the electrostatic chuck may be damaged. In addition, since particles generated by a repetitive operation of the lift pin due to a wide diameter of the pin hole are exposed to a surface of the electrostatic chuck, electrical discharge may occur. Further, when the lift pin accidentally contacts a low resistance point by design of the lift pin, electrical discharge may occur since the plasma is introduced into the lift pin.

SUMMARY OF THE INVENTION

Accordingly, the present disclosure has been made keeping in mind the above problems occurring in the related art, and an objective of the present disclosure is to provide an electrostatic chuck capable of preventing an electrical discharge from occurring in a substrate processing apparatus, and is to provide a method of manufacturing the electrostatic chuck.

The objectives of the present disclosure are not limited thereto, and other objectives and other advantages of the present disclosure will be understood from the following description.

According to an embodiment of the present disclosure, an electrostatic chuck includes a chuck body which supports a substrate, at least one pin hole penetrating the chuck body in a vertical direction, a lift pin disposed in one of the at least one pin hole, wherein the lift pin moves along the one of the at least one pin hole, and an expansion member which is provided at an inner circumference of the one of the at least one pin hole, the expansion member having an inner circumferential surface that, in response to a first power, selectively holds or releases an outer circumferential surface of the lift pin.

According to an embodiment of the present disclosure, a substrate processing apparatus includes a processing chamber providing a substrate processing space, an electrostatic chuck disposed in the substrate processing space, and a plasma generator for generating a plasma in the substrate processing space. The electrostatic chuck includes a chuck body which supports a substrate, at least one pin hole penetrating the chuck body in a vertical direction, a lift pin disposed in one of the at least one pin hole, wherein the lift pin moves along the one of the at least one pin hole, and an expansion member which is provided at an inner circumference of the one of the at least one pin hole, the expansion member having an inner circumferential surface that, in response to a first power, selectively holds or releases an outer circumferential surface of the lift pin. The expansion member includes a piezoelectric material in a tubular shape. The piezoelectric material in the tubular shape, in response to the first power being supplied thereto, expands to contact the outer circumferential surface of the lift pin.

According to an embodiment of the present disclosure, a substrate processing method using an electrostatic chuck, the electrostatic chuck comprising: a chuck body which supports a substrate and through which at least one pin hole is formed in a vertical direction and in which a lift pin is accommodated in one of the at least one pin hole to move up or move down along the one of the at least one pin hole; an electrode mounted in the chuck body and supplying a power to the chuck body to cause the chuck body to generate an electromagnetic force; and a piezoelectric material which is provided at an inner circumference of the one of the at least one pin hole and which, in response to the power, expands, the piezoelectric material having an inner circumferential surface that contacts an outer circumferential surface of the lift pin when the piezoelectric material expands, the lift pin being accommodated in the one of the at least one pin hole, includes performing a plasma processing while a length of the inner circumference of the pin hole is reduced as the piezoelectric material expands when the substrate is chucked since the power is applied to the chuck body.

According to an embodiment of the present disclosure, a method of manufacturing an electrostatic chuck, the method includes forming a pin hole extending from an upper surface of a chuck body to a lower surface of the chuck body, a lift pin moving up or moving down along the pin hole, inserting an expansion member into an upper end portion of the pin hole, the expansion member having an inner circumferential surface that contacts an outer circumferential surface of the lift pin when the expansion member expands, and fixing the inserted expansion member to the chuck member.

According to an embodiment of the present disclosure, since an inverse piezoelectric effect occurs by supplying a current to the piezoelectric element that is applied to the pin hole, the piezoelectric element expands by the inverse piezoelectric effect. Further, the diameter of the pin hole is reduced, and a cooling gas is prevented from being introduced into the pin hole and particles are prevented from leaking to the outside of the pin hole, so that the occurrence of electrical discharge in the substrate processing apparatus may be minimized.

In addition, by applying the piezoelectric element having a volume resistivity higher than a volume resistivity of the chuck member, resistivity around the lift pin is increased, so that a possibility of inflow of the plasma through the pin hole may be reduced.

The effects of the present disclosure are not limited thereto and it should be understood that the effects include all effects that can be inferred from the configuration of the present disclosure described in the following specification or claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

The terminology employed in the present specification and accompanying drawings are provided for the convenience of explanation, but the inventive concept is not limited thereto. In describing the present disclosure, a detailed description of known functions and configurations will be omitted when it may obscure the subject matter of the present disclosure. The embodiments set forth in the following description are provided to allow those skilled in the art to apparent understand the inventive concept and thus the inventive concept is not limited to the embodiments set forth in the following description. The modifications and the variations of the inventive concept are possible within the scope of the inventive concept.

In an embodiment of the present disclosure, a substrate processing apparatus etching a substrate by using plasma, the apparatus having an Inductively Coupled Plasma (ICP) source, will be described. However, the present disclosure is not limited thereto. Further, the present disclosure is applicable to various types of apparatuses, such as a substrate processing apparatus having a Capacitively Coupled Plasma (CCP) source, performing a process for a substrate and having a lift pin.

In addition, in an embodiment of the present disclosure, an electrostatic chuck will be described as an example of a substrate supporting unit. However, the present disclosure is not limited thereto. Further, when the electrostatic chuck is not necessarily required, the substrate supporting unit may support a substrate by mechanical clamping or by using vacuum.

Figure 1:
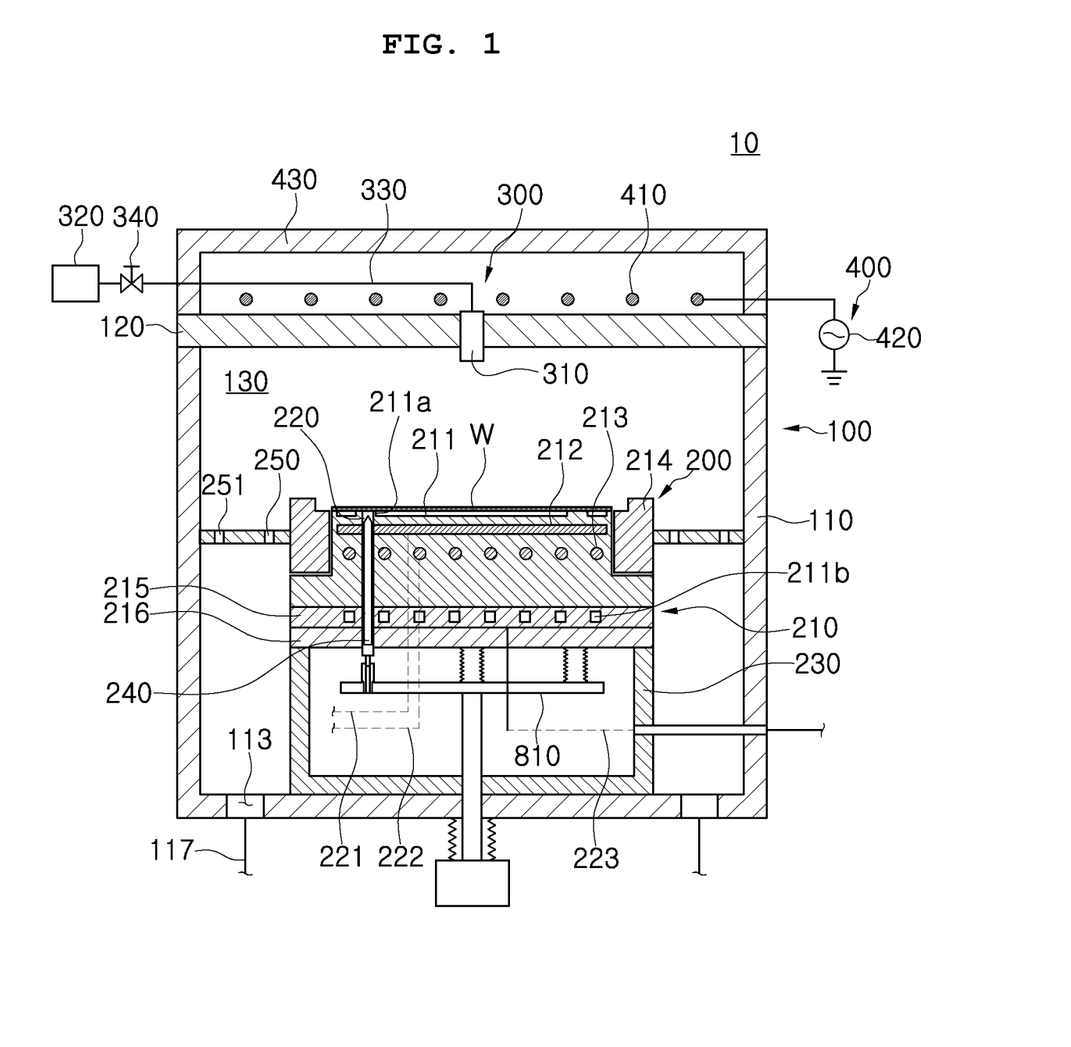
FIG. 1 is a cross-sectional view illustrating a substrate processing apparatus according to an embodiment of the present disclosure.

FIG. 1 is a cross-sectional view illustrating a substrate processing apparatus according to an embodiment of the present disclosure.

Referring to FIG. 1, a substrate processing apparatus 10 processes a substrate W by using plasma. For example, the substrate processing apparatus 10 may perform an etching process on the substrate W. The substrate processing apparatus 10 may include a chamber 100, a substrate supporting unit 200, a gas supply unit 300, and a plasma source unit 400.

The chamber 100 provides a space in which a plasma processing is performed, and the substrate supporting unit 200 supports the substrate W inside the chamber 100. The gas supply unit 300 supplies process gas into the chamber 100 and the plasma source unit 400 provides electromagnetic waves into the chamber 100 to generate plasma from the process gas. Hereinafter, each configuration will be described in detail.

The chamber 100 includes a chamber body 110 and a cover 120. The chamber body 110 has an open upper surface, and a space is formed inside the chamber body 110. An exhaust hole 113 is formed in a bottom wall of the chamber body 110. The exhaust hole 113 is connected to an exhaust line 117, and provides a passage for discharging gas remaining inside the chamber body 110 and for discharging reaction by-products that are produced during a process procedure, to the outside. A plurality of exhaust holes 113 may be formed in edge regions of the bottom wall of the chamber body 110.

The cover 120 seals the open upper surface of the chamber body 110. The cover 120 has a radius corresponding to a circumference of the chamber body 110. The cover 120 may be formed of a dielectric material. The cover 120 may be formed of an aluminum material. A space surrounded by the cover 120 and the chamber body 110 is provided as a processing space 130 in which the plasma processing process is performed.

A baffle 250 controls a flow of the process gas inside the chamber 100. The baffle 250 is provided in a ring shape, and is interposed between the chamber 100 and the substrate supporting unit 200. Distribution holes 251 are formed in the baffle 250. The process gas remaining in the chamber 100 is introduced into the exhaust holes 113 through the distribution holes 251. The flow of the process gas introduced into the exhaust holes 113 may be controlled according to a shape and an arrangement of the distribution holes 251.

The gas supply unit 300 supplies the process gas into the chamber 100. The gas supply unit 300 includes a nozzle 310, a gas storage portion 320, and a gas supply line 330.

The nozzle 310 is mounted at the cover 120. The nozzle 310 may be positioned at a center region of the cover 120. The nozzle 310 is connected to the gas storage portion 320 through the gas supply line 330. A valve 340 is mounted at the gas supply line 330. The valve 340 opens and closes the gas supply line 330, and adjusts the supply flow rate of the process gas. The process gas stored in the gas storage portion 320 is supplied to the nozzle 310 through the gas supply line 330, and is sprayed into the chamber 100 from the nozzle 310. The nozzle 310 mainly supplies the process gas to a central region of the processing space 130. In an embodiment, the gas supply unit 300 may further include another nozzle (not illustrated) mounted on a sidewall of the chamber body 110. Another nozzle supplies the process gas to an edge region of the processing space 130.

The plasma source unit 400 produces plasma from the process gas. The plasma source unit 400 includes an antenna 410, a power supply 420, and an upper cover 430.

The antenna 410 is provided at an upper portion of the chamber 100. The antenna 410 may be provided in the form of a spiral coil. The power supply 420 is connected to the antenna 410 through a cable, and applies high-frequency power to the antenna 410. As the high-frequency power is applied to the antenna 410, electromagnetic waves are generated from the antenna 410. The electromagnetic waves form an induced electric field inside the chamber 100. The process gas is changed to plasma by obtaining energy required for ionization from the induced electric field. The plasma may be applied to the substrate W and an etching process may be performed.

The substrate supporting unit 200 is positioned in the processing space 130, and supports the substrate W. The substrate supporting unit 200 may fix the substrate W by using an electrostatic force or may support the substrate W in a mechanical clamping manner. Hereinafter, an example in which the substrate supporting unit 200 is an electrostatic chuck that fixes the substrate W by using the electrostatic force will be described.

The electrostatic chuck 200 includes a chuck member 210, a housing 230, and a lift pin 240.

The chuck member 210 holds the substrate W by using the electrostatic force. The chuck member 210 may include a dielectric plate 211, an electrode 212, a heater 213, a focus ring 214, an insulating plate 215, and a grounding plate 216.

The dielectric plate 211 is provided in a circular plate shape. An upper surface of the dielectric plate 211 may have a radius corresponding to or smaller than a radius of the substrate W. Protrusion portions 211a may be formed on the upper surface of the dielectric plate 211. The substrate W is placed on the protrusion portions 211a and is spaced apart from the dielectric plate 211 by a predetermined distance. A side surface of the dielectric plate 211 may be stepped such that a lower region of the dielectric plate 211 has a radius larger than a radius of an upper region of the dielectric plate 211. For example, the dielectric plate 211 may be formed of $Al_2O_3$.

The electrode 212 is buried inside the dielectric plate 211. The electrode 212 is a circular plate having a thinner thickness and is formed of a conductive material. Further, the electrode 212 is connected to an external power source (not illustrated) through a first cable 221. A power applied from the external power source generates the electrostatic force between the electrode 212 and the substrate W, and fixes the substrate W on the upper surface of the dielectric plate 211. The external power source may be a DC power source.

The heater 213 is provided inside the dielectric plate 211. The heater 213 may be provided under the electrode 212. The heater 213 is connected to the external power source (not illustrated) through a second cable 222. The heater 213 generates heat by resisting against a current applied thereto from the external power source. The generated heat is transferred to the substrate W through the dielectric plate 211, and heats the substrate W to a predetermined temperature. The heater 213 is provided in the form of a spiral coil. Further, the heater 213 may be buried inside the dielectric plate 211 at a uniform distance.

The focus ring 214 is provided in a ring shape and is disposed along a circumference of the upper region of the dielectric plate 211. An upper surface of the focus ring 214 may be stepped such that an inner portion of the upper surface of the focus ring 214 adjacent to the dielectric plate 211 is lower than an outer portion of the upper surface of the focus ring 214. The inner portion of the upper surface of the focus ring 214 may be positioned such that a height of the inner portion of the upper surface of the focus ring 214 is equal to a height of the upper surface of the dielectric plate 211. The focus ring 214 expands a region where the electromagnetic field is formed such that the substrate W is positioned at the center of a region where the plasma is formed. Accordingly, the plasma may be uniformly formed throughout the whole region of the substrate W.

The insulating plate 215 is positioned under the dielectric plate 211, and supports the dielectric plate 211. The insulating plate 215 is a circular plate having a predetermined thickness, and may have a radius corresponding to the radius of the dielectric plate 211. The insulating plate 215 is formed of an insulating material. The insulating plate 215 is connected to the external power source (not illustrated) through a third cable 223. The high-frequency current applied to the insulating plate 215 through the third cable 223 forms the electromagnetic field between the electrostatic chuck 200 and the cover 120. The electromagnetic field is provided as an energy to generate the plasma.

A cooling flow passage 211b may be formed in the insulating plate 215. The cooling flow passage 211b is positioned under the heater 213. The cooling flow passage 211b provides a passage through which a cooling fluid circulates. The heat of the cooling fluid is transferred to the dielectric plate 211 and the substrate W, and the dielectric plate 211 and the substrate W that are heated are rapidly cooled. The cooling flow passage 211b may be formed in a spiral shape. In an embodiment, the cooling flow passage 211b may be provided such that passages which are famed in a ring shape and which respectively have a radius different from each other have an equal center. Each of the passages may communicate with each other. In an embodiment, the cooling flow passage 211b may be formed in the grounding plate 216.

The grounding plate 216 is positioned under the insulating plate 215. The grounding plate 216 is a circular plate having a predetermined thickness, and may have a radius corresponding to the radius of the insulating plate 215. The grounding plate 216 is grounded. The grounding plate 216 electrically insulates the insulating plate 215 from the chamber body 110.

A pin hole 220 is formed in the chuck member 210. The pin hole 220 is formed in an upper surface of the chuck member 210. In addition, the pin hole 220 may be vertically formed through the chuck member 210. The pin hole 220 is provided from the upper surface of the dielectric plate 211 toward a lower surface of the grounding plate 216 by sequentially passing through the dielectric plate 211, the insulating plate 215, and the grounding plate 216.

A plurality of pin holes 220 may be formed. The plurality of pin holes 220 may be arranged in a circumferential direction of the dielectric plate 211. For example, three pin holes 220 may be arranged in the circumferential direction of the dielectric plate 211 while being spaced apart from each other at 120 degrees. In addition, four pin holes 220 may be arranged in the circumferential direction of the dielectric plate 211 while being spaced apart from each other at 90 degrees. Further, various numbers of pin holes 220 may be formed.

In addition, the pin hole 220 may be formed in the protrusion portion 211a of the dielectric plate 211. For example, the pin hole 220 having a circular shape may be formed at the center of the protrusion portion 211a having a circular planar shape. However, the protrusion portion 211a and the pin hole 220 may be variously provided when viewed from the plane view. The pin hole 220 may be formed in a portion of the protrusion portion 211a. For example, six protrusion portions 211a may be arranged in the circumferential direction of the dielectric plate 211 while being spaced apart from each other at 60 degrees, and three pin holes 220 may be arranged while being spaced apart from each other at 30 degrees. An accommodating groove in which an expansion member 500 that will be described later is accommodated may be formed in an upper end of the pin hole 220.

The housing 230 is positioned under the grounding plate 216, and supports the grounding plate 216. The housing 230 is formed in a cylindrical shape having a predetermined height, and a space is formed inside the housing 230. The housing 230 may have a radius corresponding to the radius of the grounding plate 216. Various cables (not illustrated) and the lift pin 240 are positioned inside the housing 230.

As the lift pin 240 moves up and down, the lift pin 240 loads the substrate W onto the dielectric plate 211 or unloads the substrate W from the dielectric plate 211. The lift pin 240 supports the substrate W.

A plurality of lift pins 240 is provided, and is respectively accommodated inside the pin holes 220. Here, a diameter of the lift pin 240 may be slightly less than a diameter of the pin hole 220. Specifically, the diameter of the lift pin 240 may be provided to a minimum diameter at which the lift pin 240 does not contact an inner wall of the pin hole 220 when the lift pin 240 and the pin hole 220 are disposed to have an equal central axis.

The lift pin 240 may be driven in a vertical direction by a driving portion (not illustrated).

Figure 2A:
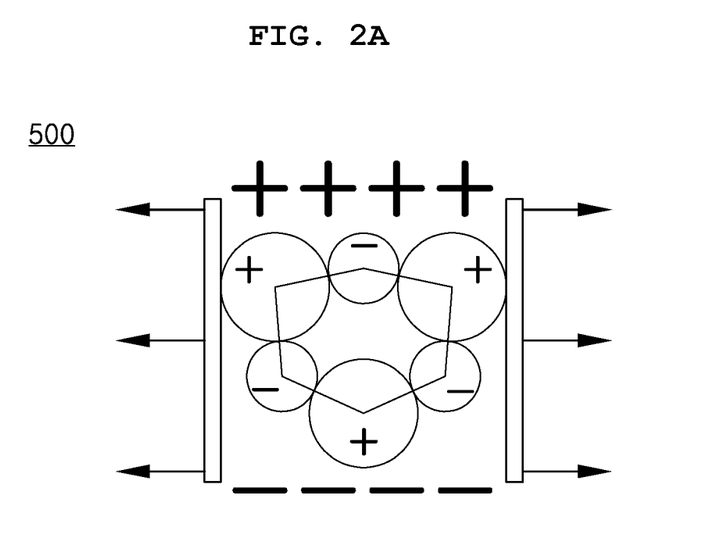
FIG. 2A and 2B are views illustrating a structure of a plurality of pin holes according to an embodiment of the present disclosure.
Figure 2B:
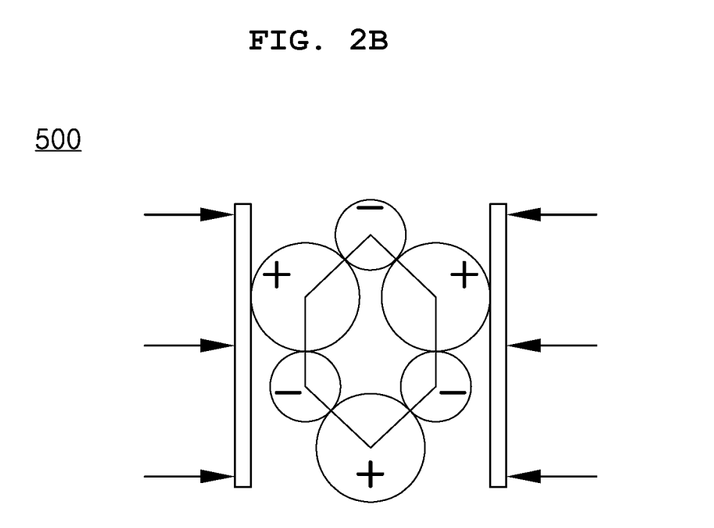

Referring to FIGS. 2A and 2B, the pin hole 220 may be configured such that the diameter of the pin hole 220 can be changed.

The electrostatic chuck 200 according to an embodiment of the present disclosure may further include the expansion member 500 provided at an inner circumference of the pin hole 220. The expansion member 500 may reversibly and repeatedly perform expansion and restoration, and is configured such that a size of an inner circumference of the expansion member 500 is changed according to the expansion and the restoration of the expansion member 500. In a normal state, the size of the inner circumference of the expansion member 500 is slightly larger than the diameter of the lift pin 240. Further, when the expansion member 500 expands, the size of the inner circumference of the expansion member 500 is changed to be equal to the diameter of the lift pin 240 as the expansion member 500 expands toward an inner portion of the pin hole 220. Therefore, when the expansion member 500 expands, an inner circumferential surface of the expansion member 500 is in close contact with an outer circumferential surface of the lift pin 240, and the diameter of the pin hole 220 in which the expansion member 500 is applied becomes smaller than the diameter of the pin hole 220 in the normal state.

For example, the expansion member 500 may include or may be formed of a piezoelectric element (i.e., a piezoelectric material) that expands when the power is supplied. The reference number of 500 may interchangeably refer to the expanding member and the piezoelectric element. Specifically, a piezoelectric element 500 formed in a tubular shape may be inserted into the upper surface of the dielectric plate 211 where the upper end portion of the pin hole 220 is formed. Here, an inner diameter of the piezoelectric element 500 formed in the tubular shape in a state in which no current flows is formed to have the same diameter of the pin hole 220. At this time, the piezoelectric element 500 is mounted such that the piezoelectric element 500 is electrically connected to the electrode 212 which is buried inside the dielectric plate 211 and which generates the electrostatic force on the chuck member 210.

A piezoelectric effect is a phenomenon in which a polarization is formed on an entire of an object. In this phenomenon, an ionic crystal structure is changed when a pressure is applied, and the center of +ions and the center of −ions are dislocated and a symmetry is dislocated, so that a dipole moment is formed, thereby forming the polarization. As a result, the piezoelectric effect is a phenomenon in which a mechanical energy is converted into an electrical energy, and the piezoelectric element refers to an element generating the piezoelectric phenomenon. Since the piezoelectric effect is reversible, an inverse piezoelectric effect in which a mechanical deformation occurs is generated when the electrical energy is applied to the piezoelectric element.

Figure 3A:
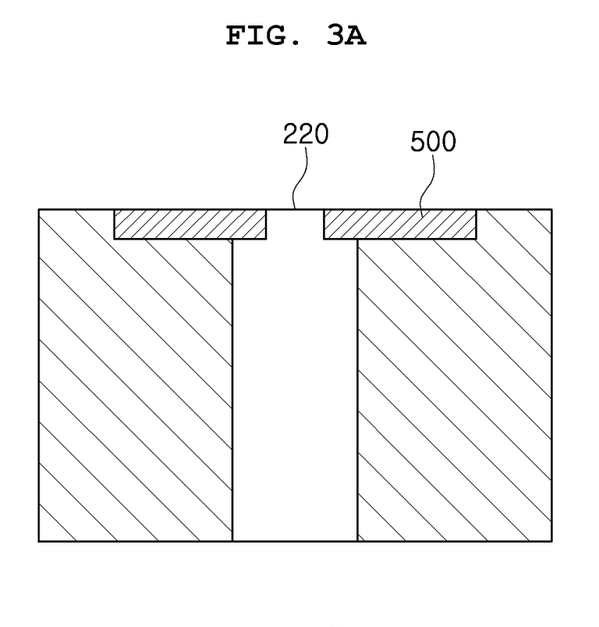
FIGS. 3A, 3B, and 4 are views illustrating operations of each of the plurality of pin holes according to an embodiment of the present disclosure.
Figure 3B:
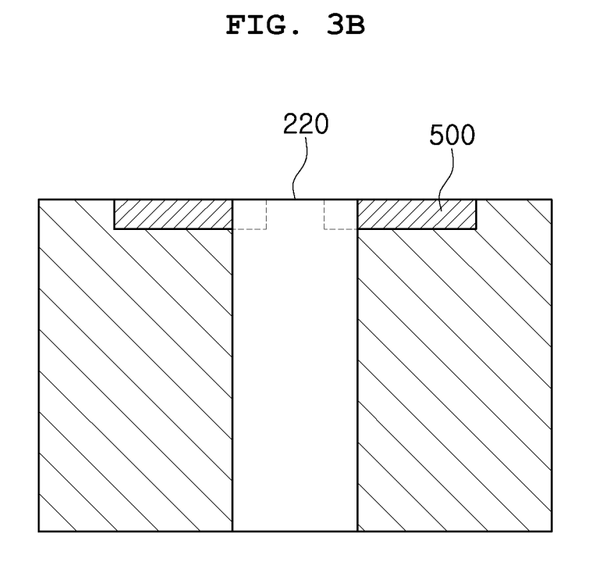
Figure 4:
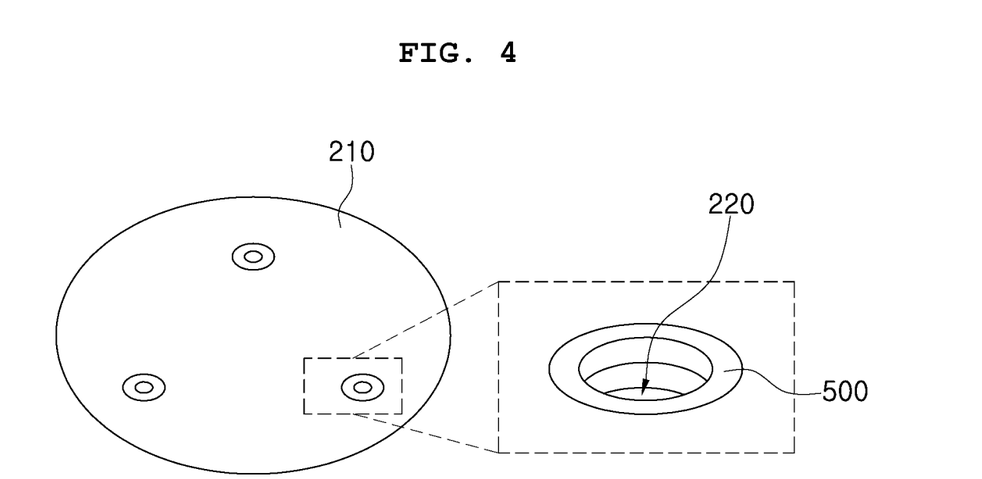

FIGS. 3A, 3B and 4 are views illustrating the inverse piezoelectric effect occurring on the piezoelectric element.

According to an embodiment of the present disclosure, when a chucking operation for the substrate W is performed, the power is supplied to the piezoelectric element 500 by the power applied to the electrode 212, the piezoelectric element 500 being electrically connected to the electrode 212, and the inverse piezoelectric effect occurs. That is, the piezoelectric element 500 inserted into the upper end portion of the pin hole 220 may expand (see FIG. 3A). As the piezoelectric element 500 applied to the pin hole 220 expands by the inverse piezoelectric effect, the diameter of the pin hole 220 may be reduced compared to the diameter of the pin hole 220 in the normal state (see FIG. 3). That is, when the power is applied in order to generate the electrostatic force on the chuck member 210, the power is also applied to the piezoelectric element 500 that is connected to the electrode 212 of the chuck member 210, and an electric energy is applied to the piezoelectric element 500. Accordingly, the mechanical deformation in which the piezoelectric element 500 expands occurs, and the diameter of the pin hole 220 is reduced.

On the other hand, when a dechucking operation for the substrate W is performed, the power applied to the electrode 212 is blocked and also the power applied to the piezoelectric element 500 is blocked, and the inverse piezoelectric effect disappears. Therefore, the expanded piezoelectric element 500 may be restored to an original (normal) size (see FIG. 3B). As a result, the diameter of the pin hole 220 may be restored to the diameter before the pin hole 220 is reduced (see FIG. 3B). That is, when the power applied to the chuck member 210 is blocked, the piezoelectric element 500 is restored to an original state, and the diameter of the pin hole 220 is also restored to an original state.

Generally, the chucking operation of the substrate W is maintained when the process for the substrate W is performed. Further, when the process for the substrate W is completed, the dechucking operation of the substrate W is performed. Therefore, when the process for the substrate W is performed, the diameter of the pin hole 220 may be in the reduced state.

When the piezoelectric element 500 expands and the diameter of the pin hole 220 is reduced, the inner circumferential surface of the piezoelectric element 500 is in close contact with the outer circumferential surface of the lift pin 240, so that a gap existing between the pin hole 220 and the lift pin 240 disappears. Therefore, a possibility of inflow of a cooling gas that frequently inflows through the gap between the pin hole 220 and the lift pin 240 is reduced. Further, a possibility of leaking of particles generated inside the pin hole 220 by the vertical movement of the lift pin 240 to a surface of the chuck member 210 through the gap between the pin hole 220 and the lift pin 240 may be significantly reduced.

In addition, when the piezoelectric element 500 is provided with a material having a high volume resistivity compared to the dielectric plate 211, a resistivity around the pin hole 220 is increased, and a possibility of inflow of the plasma through the pin hole 220 may be reduced.

As such, as the possibility of inflow of the cooling gas and the plasma toward the inner portion of the pin hole 220 is reduced, an electrical discharge phenomenon is prevented from occurring inside the pin hole 220.

Meanwhile, the piezoelectric element 500 is provided in a state in which the piezoelectric element 500 is completely coupled to the inside of the pin hole 220 formed at the dielectric plate 211 by using a sintering method and so on. Therefore, by providing the piezoelectric element 500 with a material having a dielectric constant equal to a dielectric constant of the dielectric plate 211, the ease of coupling the piezoelectric element 500 to the dielectric plate 211 may be increased. For example, the piezoelectric element 500 may be formed of a piezoelectric ceramic material which has a dielectric constant equal to the dielectric constant of the dielectric plate 211 and which has a high volume resistivity.

Meanwhile, although not illustrated in detail, the piezoelectric element 500 may be provided such that the piezoelectric element 500 is supplied with the power separately from the electrode 212. That is, the piezoelectric element 500 may be supplied with the electric energy by being connected to a power source (not illustrated) that is controlled independently from a power source applied to the electrode 212. The piezoelectric element 500 may reduce the diameter of the pin hole 220 by receiving the electric energy from the separate power source (not illustrated) and by expanding. Further, the piezoelectric element 500 may be maintained (restored) to the original state when the electric energy is not supplied to the piezoelectric element 500.

As described above, a substrate processing method according to an embodiment of the present disclosure may include a substrate chucking process, a plasma processing process performed on a chucked substrate, and a substrate dechucking process.

The substrate chucking process is performed by applying the power to the electrode 212 mounted in the chuck member 210, thereby generating the electrostatic force for the substrate. At this time, the electric energy is supplied to the piezoelectric element 500 that is electrically connected to the electrode 212, and the diameter of the inner circumference of the pin hole 220 is reduced since the piezoelectric element 500 expands by the inverse piezoelectric effect. The substrate chucking process is maintained during performing the plasma processing process performed on the substrate. Therefore, during performing the plasma processing process, the diameter of the inner circumference of the pin hole 220 remains reduced.

When the piezoelectric element 500 expands and the diameter of the pin hole 220 is reduced, the inner circumferential surface of the piezoelectric element 500 is in close contact with the outer circumferential surface of the lift pin 240, so that the gap existing between the pin hole 220 and the lift pin 240 disappears. Therefore, the possibility of inflow of the cooling gas that frequently inflows through the gap between the pin hole 220 and the lift pin 240 is reduced. Further, the possibility of leaking of particles generated inside the pin hole 220 by the vertical movement of the lift pin 240 to the surface of the chuck member 210 through the gap between the pin hole 220 and the lift pin 240 may be significantly reduced.

In addition, when the piezoelectric element 500 is provided with a material having a high volume resistivity compared to the dielectric plate 211, a resistivity around the pin hole 220 is increased, and the possibility of inflow of the plasma through the pin hole 220 may be reduced.

As such, during performing the plasma processing process, the possibility of inflow of the cooling gas and the plasma toward the inner portion of the pin hole 220 is reduced by the expansion member 500, so that the electrical discharge phenomenon is prevented from occurring inside the pin hole 220.

When the plasma processing process is completed, the substrate dechucking process is performed. Further, in the substrate dechucking process, the power supplied to the electrode 212 of the chuck member 210 is blocked. Accordingly, the power supplied to the piezoelectric element 500 is also blocked, and the inverse piezoelectric effect disappears, so that the expanded piezoelectric element 500 may be restored to the original state. As the piezoelectric element 500 is restored, a length of the inner circumference of the pin hole 220 that is reduced may also be restored to a length before the pin hole 220 is reduced.

Then, in order to take the substrate on which the plasma processing process has been completed out of the processing space, the lift pin 240 may be moved upward.

Figure 5:
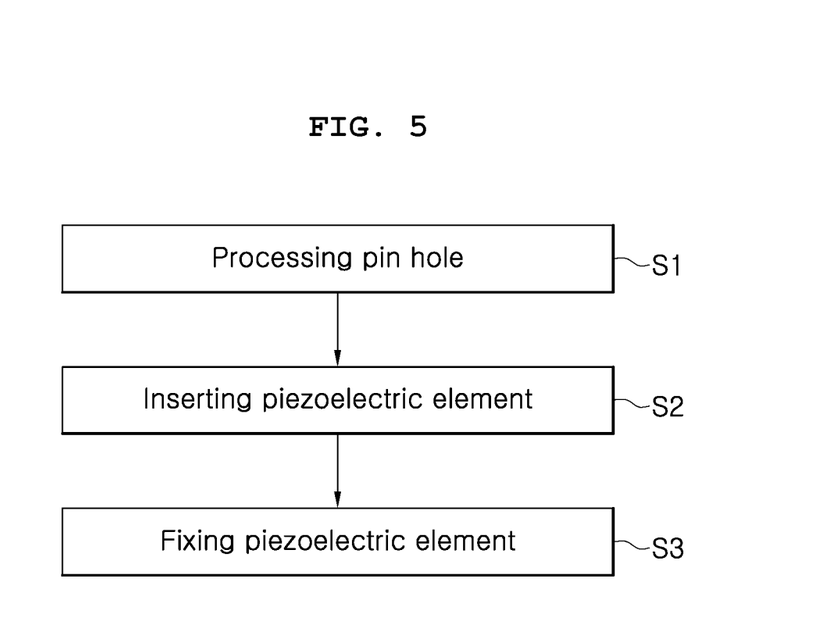
FIG. 5 is a flowchart illustrating a method of manufacturing an electrostatic chuck according to an embodiment of the present disclosure.

FIG. 5 is a flowchart illustrating a method of manufacturing an electrostatic chuck according to an embodiment of the present disclosure.

The electrostatic chuck 200 according to an embodiment of the present disclosure is manufactured to include the expansion member 500. The expansion member 500 is inserted into the upper end portion of the pin hole 220 formed in the chuck member 210. Further, the expansion member 500 includes an inner circumferential surface that is in close contact with the outer circumferential surface of the lift pin 240 that is accommodated in the pin hole 220 while the lift pin 240 is capable of moving up and down when the expansion member 500 expands. A size of the inner circumference of the expansion member 500 in the normal state is provided to be equal to a size of the inner circumference of the pin hole 220. For example, the expansion member 500 may be a piezoelectric element that expands by receiving the power.

By using the expansion member 500 that is applied to the upper end portion of the pin hole 220 that is formed through the chuck member 210, the diameter of the pin hole 220 may be changed.

The method of manufacturing the electrostatic chuck according to an embodiment of the present disclosure may include processing the pin hole 220 in the chuck member 210 (S1), inserting the expansion member 500 into the upper end portion of the pin hole 220 (S2), and fixing the expansion member to the chuck member 210 (S3).

The processing of the pin hole 220 (S1) is a process of processing the pin hole 220 in which the lift pin 240 capable of moving up and down is accommodated in the chuck member 210, and is a process of processing the pin hole 220 such that the pin hole 220 penetrates through the upper surface and the lower surface of the chuck member 210. The processing of the pin hole 220 (S1) may include a counter-boring process in which the upper surface of the chuck member 210 that is also the upper end portion of the pin hole 220 is processed to have a shape of the expansion member 500 that will be inserted. In the processing of the pin hole 220 process (S1), at least one of the pin holes 220 are processed, and at least one of the pin holes 220 may be processed before sintering the electrostatic chuck.

The piezoelectric element 500 formed in a tubular shape may be inserted into the upper surface of the processed chuck member 210. Specifically, the piezoelectric element 500 may be inserted into the upper surface of the dielectric plate 211. The piezoelectric element 500 is an element generating the piezoelectric effect, and may expand according to the supplied power. In addition, the piezoelectric element 500 may be formed of a material having a volume resistivity higher than a volume resistivity of the dielectric plate 211, and may have the dielectric constant equal to the dielectric constant of the dielectric plate 211.

The piezoelectric element 500 may be inserted into the dielectric plate 211 so that the piezoelectric element 500 is electrically connected to the electrode 212. In an embodiment, the piezoelectric element 500 may be connected with a separate power supply and may be inserted into the dielectric plate 211.

After then, the inserted piezoelectric element 500 may be fixed to the chuck member 210 (S3). The fixing process (S3) may be performed by sintering the electrostatic chuck while the piezoelectric element 500 is inserted into the upper end portion of the pin hole 220. Meanwhile, when the pin hole 220 is processed before sintering the electrostatic chuck and then the sintering of the electrostatic chuck is performed, a distance between the pin holes 220 may not be uniform according to a shrinkage rate. Therefore, when the pin hole 220 is processed before sintering the electrostatic chuck, the pin hole 220 is required to be accurately processed so that the pin hole 220 corresponds to a predetermined position in consideration of the shrinkage rate. Meanwhile, another coupling method may be used as a fixing method of the piezoelectric element 500.

The inner diameter of the piezoelectric element 500 in the normal state is equal to the diameter of the pin hole 220 in the normal state. That is, the inner diameter of the piezoelectric element 500 is slightly larger than the diameter of the lift pin 240. Specifically, the diameter of the piezoelectric element 500 may be provided to have a minimum diameter at which the lift pin 240 does not contact the inner wall of the piezoelectric element 500 when the lift pin 240 and the piezoelectric element 500 are disposed to have the same central axis.

When the chucking operation of the substrate W is performed, the piezoelectric element 500 mounted such that the piezoelectric element 500 is electrically connected to the electrode 212 may generate the inverse piezoelectric effect by receiving the power. Specifically, when the power is applied to the piezoelectric element 500, the piezoelectric element 500 may expand. As the piezoelectric element 500 expands, the diameter of the inner circumference of the piezoelectric element 500 is reduced, so that the diameter of the inner circumference of the pin hole 220 may be reduced. The inner circumferential surface of the expanded piezoelectric element 500 may be in close contact with the outer circumferential surface of the lift pin 240.

When the dechucking operation of the substrate W is performed, the expanded piezoelectric element 500 is restored to the original state, and the reduced diameter of the pin hole 220 may be restored to the original state. When the inverse piezoelectric effect is generated on the piezoelectric element 500 and the diameter of the pin hole 220 is reduced, the gap between the pin hole 220 and the lift pin 240, the gap existing on the upper surface of the chuck member 210, may disappear. Therefore, the plasma and the cooling gas may be prevented from entering inside the pin hole 220, and the particles may be prevented from leaking to the surface of the chuck member 210 from the pin hole 220. Accordingly, the occurrence of electrical discharge (arcing) in the pin hole 220 and in the substrate processing apparatus may be minimized.

As described above, the electrostatic chuck 200, the substrate processing apparatus including the electrostatic chuck 200, the substrate processing method, and the method of manufacturing the electrostatic chuck 200 according to an embodiment of the present disclosure have been described with reference to FIGS. 1 to 5. The electrostatic chuck 200 according to an embodiment of the present disclosure includes the expansion member 500 inserted into the inner circumference of the pin hole 220. The expansion member 500 may reversibly and repeatedly perform the expansion and the restoration. Further, by the inner circumferential surface of the expansion member 500 that is in close contact with the outer circumferential surface of the lift pin 240 when the expansion member 500 expands, the fine gap existing between the pin hole 220 and the lift pin 240 may be temporarily removed. The expansion member 500 may be the piezoelectric element that expands by receiving the power, and may maintain the expanding state during performing the plasma processing process. When the expansion member 500 remains expanded during performing the plasma processing process, the plasma and the cooling gas that are entering the inside of the pin hole 220 through the gap between the pin hole 220 and the lift pin 240 may be prevented from entering. Further, particles from the inside of the pin hole 220 may be prevented from leaking to the surface of the chuck member 210. Accordingly, the occurrence of electrical discharge (arcing) in the substrate processing apparatus may be minimized.

Meanwhile, the shape of the piezoelectric element 500 is not limited to the example as described above, and may be applied in any shape that can reduce the diameter of the upper portion pin hole 220 or the entire diameter of the pin hole 220. For example, the piezoelectric element 500 may be applied to the entire inner wall of the pin hole 220.

In addition, as described above, the example in which the expansion member applied to the upper end portion of the pin hole 220 is the piezoelectric element 500 that expands when the power is applied to the piezoelectric element 500 has been described, but the shape of the expansion member is not limited thereto. Further, any shape of the expansion member capable of changing the diameter of the pin hole 220 as the expansion state and the restoration state are reversibly changed may be applied.

Although the embodiments of the present disclosure have been disclosed for illustrative purposes, those skilled in the art will appreciate that various modifications, additions and substitutions are possible, without departing from the scope and spirit of the present disclosure. As described above, the embodiments and the accompanying drawings disclosed in the present disclosure are provided for describing the present disclosure and are not intended to limit the technical ideas of the present disclosure. The technical ideas of the present disclosure are not limited to the embodiments and the drawings. The scope of the present disclosure should be construed as being covered by the scope of the appended claims, and all technical ideas falling within the scope of the claims should be construed as being included in the scope of the present disclosure.

What is claimed is:

1. An electrostatic chuck, comprising:
   a chuck body which supports a substrate;
   at least one pin hole penetrating the chuck body in a vertical direction;
   a lift pin disposed in one of the at least one pin hole, wherein the lift pin moves along the one of the at least one pin hole; and
   an expansion member which is provided at an inner circumference of the one of the at least one pin hole, the expansion member having an inner circumferential surface that, in response to a first power supplied to the expansion member, selectively holds or releases an outer circumferential surface of the lift pin.

2. The electrostatic chuck of claim 1,
   wherein the expansion member includes a piezoelectric material, and
   wherein the expansion member, in response to the first power being supplied thereto, expands to contact the outer circumferential surface of the lift pin.

3. The electrostatic chuck of claim 2,
   wherein the chuck body is formed of a dielectric material,
   wherein the piezoelectric material has a dielectric constant equal to a dielectric constant of the chuck body and, and
   wherein the piezoelectric material has a volume resistivity higher than a volume resistivity of the chuck body.

4. The electrostatic chuck of claim 3,
   wherein the chuck body is sintered with the piezoelectric material.

5. The electrostatic chuck of claim 1, further comprising:
   an electrode which is mounted in the chuck body and supplies a second power to the chuck body,
   wherein the chuck body is electrically connected to the electrode,
   wherein the chuck body, in response to the second power being supplied thereto, generates an electrostatic force, and
   wherein the expansion member includes a piezoelectric material.

6. The electrostatic chuck of claim 5,
   wherein the first power is the second power supplied by the electrode,
   wherein the piezoelectric material is electrically connected to the electrode, and
   wherein the expansion member, in response to the second power being supplied by the electrode, expands to contact the outer circumferential surface of the lift pin.

7. The electrostatic chuck of claim 6,
   wherein, in response to the second power applied to the electrode being blocked, the expansion member is restored to a state before the piezoelectric material expands.

8. The electrostatic chuck of claim 5,
   wherein the first power and the second power are separately supplied to the piezoelectric material of the expansion member and the electrode, respectively, and
   wherein the first power and the second power are independently controlled.

9. The electrostatic chuck of claim 1, further comprising:
   a groove formed at an upper end of the at least one pin hole.

10. A substrate processing apparatus, comprising:
    a processing chamber providing a substrate processing space;
    an electrostatic chuck disposed in the substrate processing space; and
    a plasma generator for generating a plasma in the substrate processing space,
    wherein the electrostatic chuck comprises:
    a chuck body which supports a substrate,
    at least one pin hole penetrating the chuck body in a vertical direction,
    a lift pin disposed in one of the at least one pin hole, wherein the lift pin moves along the one of the at least one pin hole, and
    an expansion member which is provided at an inner circumference of the one of the at least one pin hole, the expansion member having an inner circumferential surface that, in response to a first power, selectively holds or releases an outer circumferential surface of the lift pin,
    wherein the expansion member includes a piezoelectric material in a tubular shape, and
    wherein the piezoelectric material in the tubular shape, in response to the first power, expands to contact the outer circumferential surface of the lift pin.

11. The substrate processing apparatus of claim 10, further comprising:
    an electrode that supplies the first power to cause the chuck body to generate an electrostatic force,
    wherein the piezoelectric material is electrically connected to the electrode, and, in response to the first power being supplied to the electrode, expands toward an inside of the one of the at least one pin hole.

12. The substrate processing apparatus of claim 11,
    wherein the piezoelectric material, in response to the first power being blocked, is restored to an original state.

13. The substrate processing apparatus of claim 12,
    wherein, when a plasma processing is performed, a state in which a length of the inner circumference of the one of the at least one pin hole is reduced is maintained as the piezoelectric material expands when the substrate is chucked since power is applied to the electrode, and
    when plasma processing is completed, the piezoelectric material is restored to a state before the piezoelectric material expands and the substrate is dechucked, in response to the power applied to the chuck body being blocked, and
    wherein the length of the inner circumference of the one of the at least one pin hole that is reduced, in response to the power being blocked, is restored to the length before the length of the inner circumference of the one of the at least pin hole is reduced.

14. The substrate processing apparatus of claim 10, further comprising:
an electrode that supplies a second power to cause the chuck body to generate an electrostatic force,
wherein the piezoelectric material is connected to the first power, and
wherein the first power and the second power are connected to separate power sources, and are independently controlled.

15. The substrate processing apparatus of claim 10, wherein the piezoelectric material has a volume resistivity higher than a volume resistivity of the chuck body.

16. The substrate processing apparatus of claim 15, wherein the chuck body is sintered with the piezoelectric material.

17. A method of manufacturing an electrostatic chuck, the method comprising:
forming a pin hole extending from an upper surface of a chuck member to a lower surface thereof, wherein a lift pin moves up or moves down along the pin hole;
inserting an expansion member into an upper end portion of the pin hole, the expansion member having an inner circumferential surface that contacts an outer circumferential surface of the lift pin when the expansion member expands; and
fixing the inserted expansion member to the chuck member,
wherein the expansion member is formed of a piezoelectric material in a tubular shape.

18. The method of claim 17,
wherein a volume resistivity of the piezoelectric material is higher than a volume resistivity of the chuck member, and
wherein the piezoelectric material expands as a power is supplied to the piezoelectric material.

19. The method of claim 17,
wherein the forming of the pin hole comprises:
counter-boring such that the upper end portion of the pin hole is formed in a shape corresponding to the expansion member.

20. The method of claim 17,
wherein at least one of the pin hole is formed in the chuck member.

* * * * *